(12) United States Patent
Kao et al.

(10) Patent No.: US 10,674,640 B1
(45) Date of Patent: Jun. 2, 2020

(54) INTEGRATED ELECTRONIC DEVICE

(71) Applicant: Delta Electronics, Inc., Taoyuan (TW)

(72) Inventors: Chao-Li Kao, Taoyuan (TW);
Jin-Zhong Huang, Taoyuan (TW);
Yi-Ping Hsieh, Taoyuan (TW);
Chang-Ye Li, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 16/264,621

(22) Filed: Jan. 31, 2019

(30) Foreign Application Priority Data

Dec. 12, 2018 (CN) .......................... 2018 1 1516525

(51) Int. Cl.
*H05K 7/20* (2006.01)
*H05K 1/18* (2006.01)
(Continued)

(52) U.S. Cl.
CPC ............... *H05K 7/209* (2013.01); *F28F 3/02* (2013.01); *H01L 23/4006* (2013.01); *H02M 7/003* (2013.01); *H02M 7/537* (2013.01); *H05K 1/0203* (2013.01); *H05K 1/184* (2013.01); *H05K 7/20909* (2013.01); *H01L 2023/4025* (2013.01); *H01L 2023/4043* (2013.01); *H01L 2023/4087* (2013.01); *H05K 2201/066* (2013.01);
(Continued)

(58) Field of Classification Search
USPC ......................................................... 361/714
See application file for complete search history.

(56) References Cited

U.S. PATENT DOCUMENTS 2,984,774 A * 5/1961 Race ...................... H05K 11/02
257/722
3,033,537 A * 5/1962 Brown, Jr. .......... H01L 23/4006
174/16.3
(Continued)

FOREIGN PATENT DOCUMENTS

CN 202563166 U 11/2012
CN 107262976 A 10/2017
(Continued)

OTHER PUBLICATIONS

Office Action dated Dec. 24, 2019 of the corresponding Taiwan patent application.

*Primary Examiner* — William H. Mayo, III
*Assistant Examiner* — Krystal Robinson
(74) *Attorney, Agent, or Firm* — Chun-Ming Shih; HDLS IPR Services (57) ABSTRACT

An electronic device with heat sink is provided. The heat sink includes a base and fins. One side of the base has a first placement plane and a second placement plane. The electronic device includes a circuit board, a power module and transistors. The power module includes a power body and soldering legs, and the power body is attached to the first placement plane. The transistor has a transistor body and pins, and the transistor body is attached to the second placement plane. The circuit board is disposed at one side of the base formed with the first placement plane, and soldering legs of the power module and pins of the transistor are inserted on the circuit board. Thereby the heat sinks and the space which the circuit board occupied will be reduced for increasing the power density of the heat sink.

13 Claims, 9 Drawing Sheets

(51) Int. Cl.
   *H01L 23/40* (2006.01)
   *H02M 7/00* (2006.01)
   *H02M 7/537* (2006.01)
   *F28F 3/02* (2006.01)
   *H05K 1/02* (2006.01)

(52) U.S. Cl.
   CPC .......... *H05K 2201/10015* (2013.01); *H05K 2201/10166* (2013.01); *H05K 2201/10522* (2013.01)

(56) References Cited

U.S. PATENT DOCUMENTS

| | | | | |
|---|---|---|---|---|
| 3,163,207 | A * | 12/1964 | Schultz | H01L 23/4006 165/68 |
| 3,411,570 | A * | 11/1968 | Kleinhample, Jr. | H01L 25/03 165/80.3 |
| 4,237,521 | A * | 12/1980 | Denker | H05K 7/20909 361/697 |
| 5,170,336 | A * | 12/1992 | Getter | H02M 7/003 361/697 |
| D336,074 | S * | 6/1993 | Friend | D13/184 |
| 5,537,074 | A * | 7/1996 | Iversen | G05F 1/70 257/712 |
| D379,088 | S * | 5/1997 | Hopper | D13/152 |
| 5,895,973 | A * | 4/1999 | Fessenden | H01L 24/28 257/675 |
| 5,909,358 | A * | 6/1999 | Bradt | H01L 23/4093 257/726 |
| 6,270,320 | B1 * | 8/2001 | Heyder | H02K 5/225 417/44.1 |
| 9,362,261 | B2 * | 6/2016 | Tokuyama | H01L 25/18 |
| 9,474,189 | B2 * | 10/2016 | Kawauchi | H02M 7/003 |
| 10,156,239 | B2 * | 12/2018 | Nakagami | H05K 7/209 |
| 2001/0015493 | A1 * | 8/2001 | Hembree | H01L 21/4871 257/733 |
| 2001/0019473 | A1 * | 9/2001 | Sunaga | H01L 23/4093 361/697 |
| 2001/0038526 | A1 * | 11/2001 | Kajiura | H05K 7/20909 361/700 |
| 2003/0047304 | A1 * | 3/2003 | Kasuga | H01L 25/11 165/185 |
| 2006/0096299 | A1 * | 5/2006 | Mamitsu | H01L 23/473 62/3.2 |
| 2006/0152907 | A1 * | 7/2006 | Rathmann | H05K 1/144 361/720 |
| 2006/0158853 | A1 | 7/2006 | Jeong | |
| 2011/0216507 | A1 * | 9/2011 | Kadomoto | H05K 7/20 361/714 |
| 2012/0087095 | A1 * | 4/2012 | Tokuyama | B60L 50/61 361/721 |
| 2013/0083485 | A1 | 4/2013 | Tong et al. | |
| 2013/0119525 | A1 * | 5/2013 | Tsuyuno | B60L 1/003 257/675 |
| 2013/0194853 | A1 * | 8/2013 | Tokuyama | H01L 23/36 363/131 |
| 2013/0285234 | A1 * | 10/2013 | Uhlemann | H01L 23/3677 257/712 |
| 2015/0037662 | A1 * | 2/2015 | Pinon | H01M 2/0237 429/179 |
| 2016/0157384 | A1 | 6/2016 | Liu et al. | |
| 2019/0230813 | A1 * | 7/2019 | Kosuga | H02M 7/48 |
| 2019/0246487 | A1 * | 8/2019 | Ito | H05K 7/1432 |
| 2019/0252292 | A1 * | 8/2019 | Nagahara | H05K 7/2089 |

FOREIGN PATENT DOCUMENTS

| | | |
|---|---|---|
| CN | 207398123 U | 5/2018 |
| TW | 200847899 A | 12/2008 |
| TW | 201620370 A | 6/2016 |

\* cited by examiner

INTEGRATED ELECTRONIC DEVICE

BACKGROUND OF THE INVENTION

Field of the Invention

The present invention generally relates to electronic devices and, in particular to electronic device with heat sink.

Description of Prior Art

Today's electronic devices are under the development of high-power and high-density, therefore, high heat generated by the electronic components during operation needs to be dissipated through heat sinks so as to maintain a normal operation and to improve the service life of electronic components.

Figure 1:
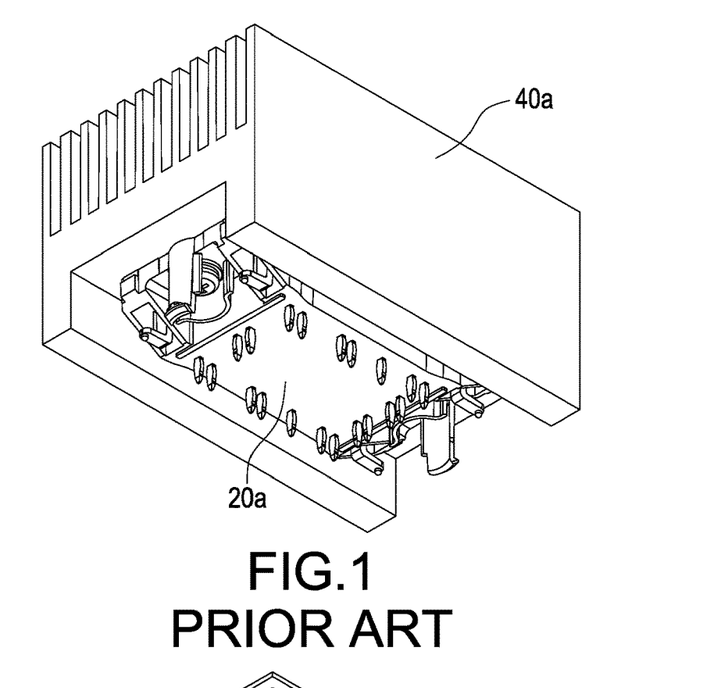
FIG. 1 to FIG. 3 are schematic views of uninterrupted device of prior art.
Figure 2:
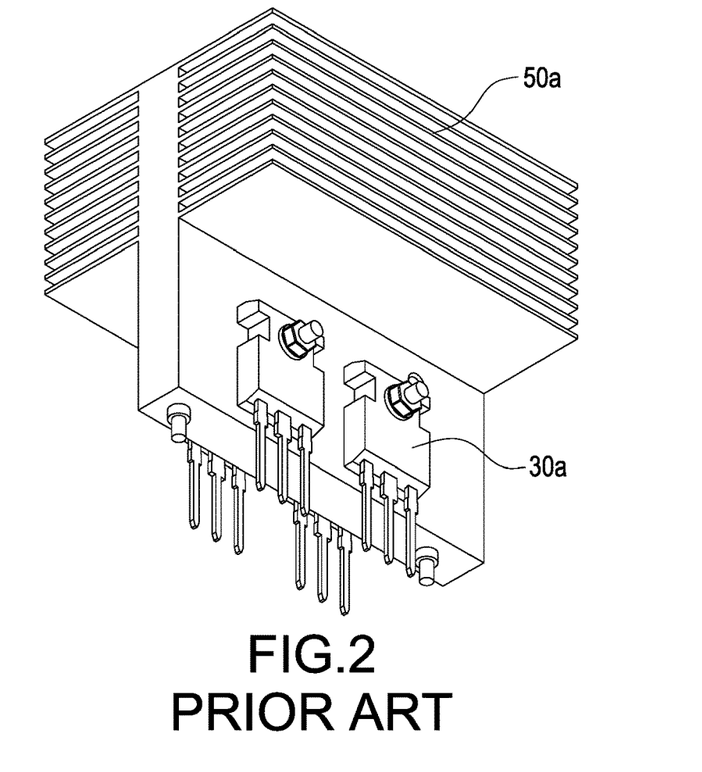
Figure 3:
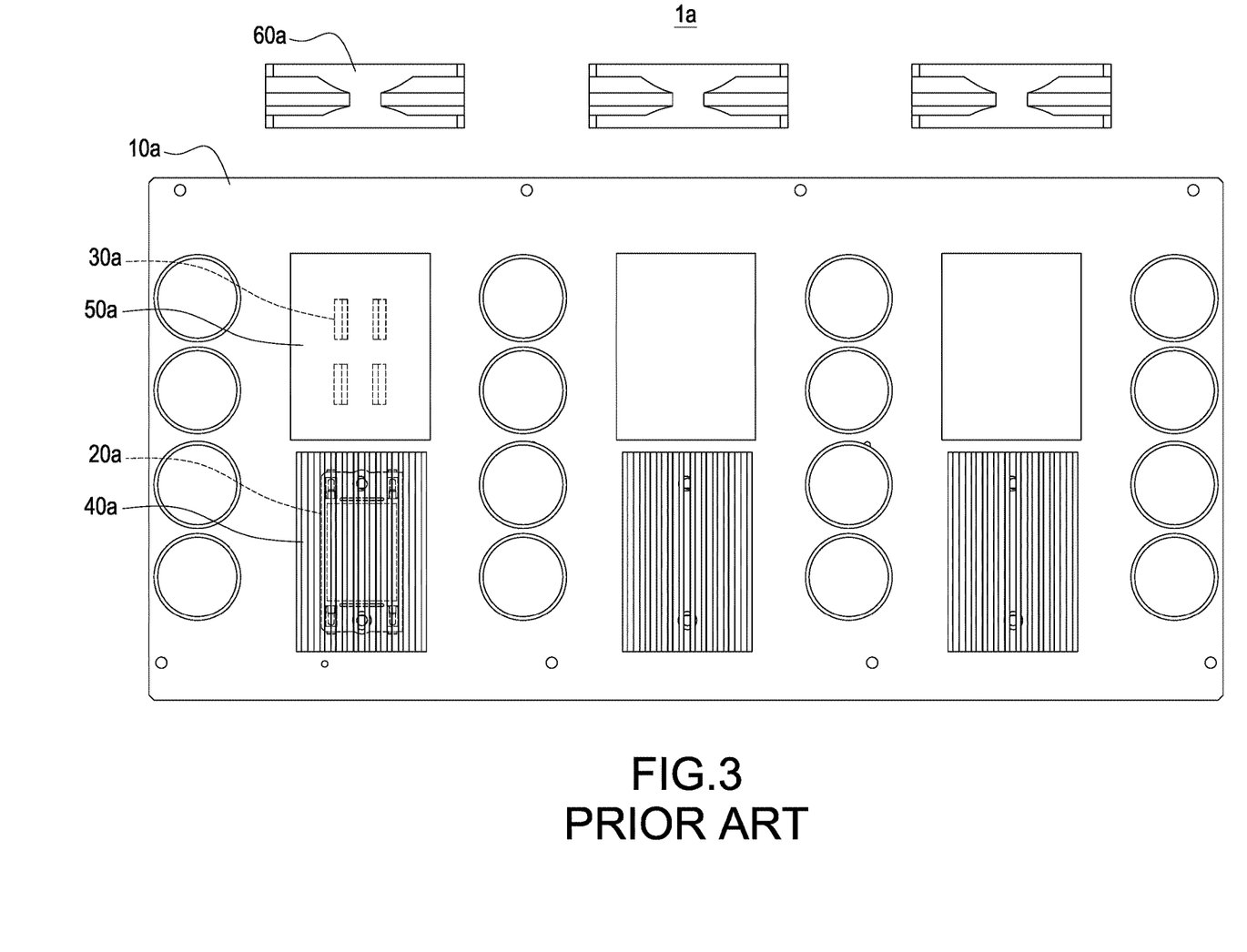

As shown in FIG. 1 to FIG. 3, they depict an uninterruptible system (UPS) with heat sink. An uninterruptible device 1a at least includes a circuit board 10a, an inverter module 20a electrically connected with the circuit board 10a and a plurality of switch components 30a. Please refer to FIG. 1 and FIG. 2, the inverter module 20a has combined with a first heat sink 40a, and the switch components 30a are combined to a second heat sink 50a. Moreover, please refer to FIG. 3, the inverter module 20a with the first heat sink 40a and the switching components 30a with the second heat sink 50a are separately disposed on the circuit board 10a to constitute an uninterruptible device 1a with heat sink.

However, in above structures of the uninterruptible device 1a with heat sink, since the inverter module 20a and the switching components 30a are separately disposed on independent heat sinks, the heat sinks occupy a large area and space of the circuit board which results to an increase in the overall volume of the electronic device. In addition, in order to improve the heat dissipation efficiency, a wing guide plate needs to be provided for guiding the forced airflow generated by the fan 60a, and that leads to an inconvenience in design.

In view of the above drawbacks, the Inventor proposes the present invention based on his expert knowledge and elaborate researches in order to solve the problems of prior art.

SUMMARY OF THE INVENTION

Accordingly, an object of the present invention is to provide an integrated electronic device for reducing the quantity of heat sinks and the space which the circuit board are occupied so that the power density of the heat sink will be enhanced.

In order to achieve the object mentioned above, the present invention provides an integrated electronic device including a heat sink and an electronic device. The heat sink includes a base and a plurality of heat dissipating fins. One side of the base has a first placement plane, and another side of the base is provided with the heat dissipating fins and has at least one second placement plane, wherein the second placement plane is adjacent to the first placement plane. The electronic device includes a circuit board, a power module and a plurality of transistors. The power module includes a power body and a plurality of soldering legs, and the power body is attached to the first placement plane. Each transistor has a transistor body and a plurality of pins, and the transistor body is attached to the second placement plane, wherein the circuit board is disposed at a side of the base where the first placement plane is formed. The soldering legs of the power module and the pins of the transistor are inserted on the circuit board.

Comparing to the prior art, in the structures of the integrated electronic device of the present invention, the power module and the transistors are attached to different sides of the same heat sink. Thereby, heat of different heating components at different places can be dissipated by the heat sink at the same time. Then it is not necessary to dispose heat sinks for the power module and the transistors separately which can reduce the number of heat sinks, and the occupied space of the circuit board can be greatly reduced for enhancing the power density of the heat sink. With comparing to conventional electronic devices with heat sink, the area of the circuit board of the present invention can be reduced by approximately 30%. In addition, airflows generated by the fan can be directly blown to the heat sink without additionally providing a wind guide plate, thus the duct design can be simplified and the practicability of the present invention can be enhanced.

BRIEF DESCRIPTION OF DRAWING

The features of the invention believed to be novel are set forth with particularity in the appended claims. The invention itself, however, may be best understood by reference to the following detailed description of the invention, which describes a number of exemplary embodiments of the invention, taken in conjunction with the accompanying drawings, in which:

DETAILED DESCRIPTION OF THE PREFERRED EMBODIMENTS

In cooperation with attached drawings, the technical contents and detailed description of the invention are described thereinafter according to a number of preferable embodiments, being not used to limit its executing scope. Any equivalent variation and modification made according to appended claims is all covered by the claims claimed by the present invention.

Figure 4:
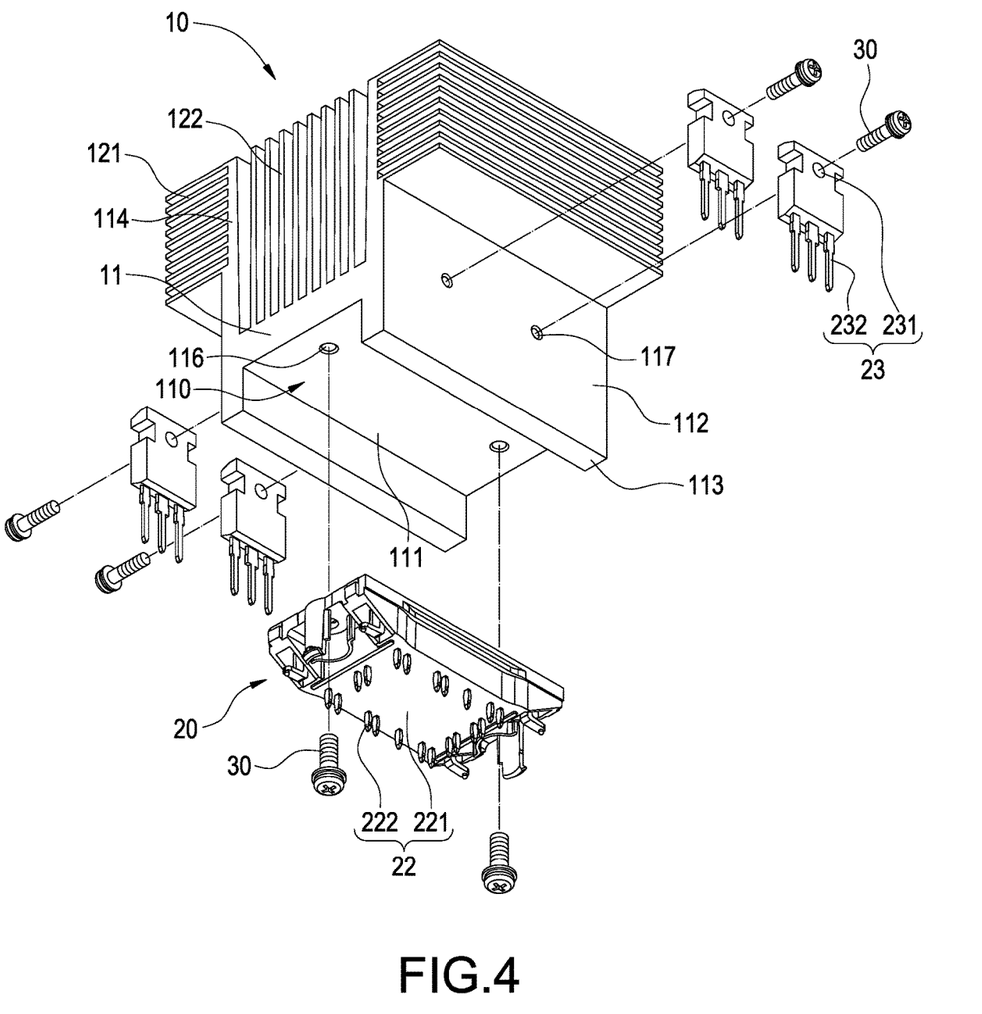
FIG. 4 is a part of perspective explosion schematic view of integrated electronic device of the FIG. 5 is a partial assembly schematic view of integrated electronic device of the present invention.
Figure 5:
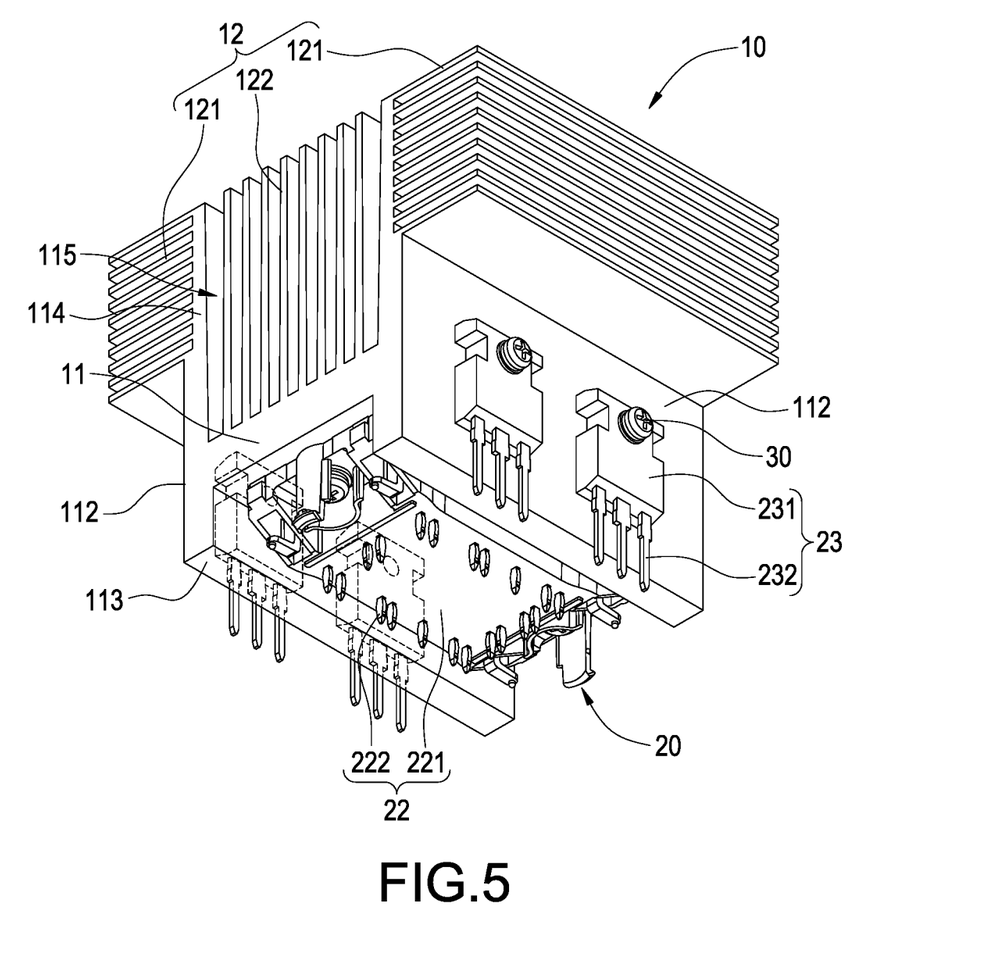
Figure 6:
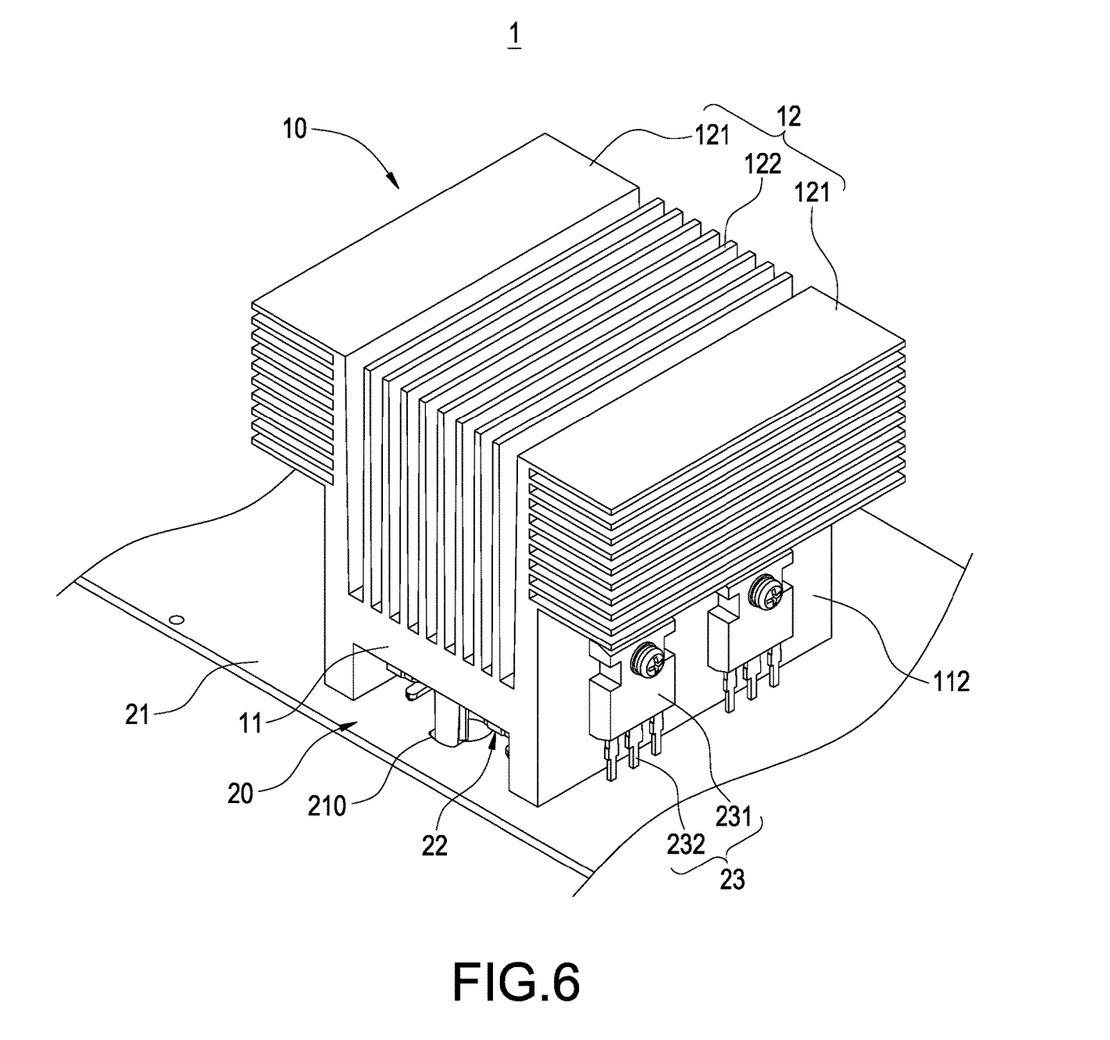
FIG. 6 is a perspective schematic view of integrated electronic device of the present invention.

Please refer to FIG. 4 to FIG. 6, which depict a part of perspective explosion schematic view, a partial assembly schematic view and a perspective schematic view of integrated electronic device of the present invention. The integrated electronic device 1 of the present invention includes a heat sink 10 and an electronic device 20. The electronic device 20 is disposed with the heat sink 10 so that the heat generated during operation of the electronic device 20 will be dissipated through the heat sink 10. More detail descriptions of the integrated electronic device structure are as follows.

In the present embodiment, the heat sink 10 is, but not limited to, an aluminum extruded heat sink in real practice. The heat sink 10 includes a base 11 and a plurality of heat dissipating fins 12. One side of the base 11 has a first placement plane 111, and another side of the base 11 is provided with the heat dissipating fins 12 and has at least one second placement plane 112, wherein the second placement plane 112 is adjacent to the first placement plane 111.

Moreover, the electronic device 20 includes a circuit board 21, a power module 22 and a plurality of transistors 23. The power module 22 includes a power body 221 and a plurality of soldering legs 222, and the power body 221 is attached to the first placement plane 111. In addition, each transistor 23 has a transistor body 231 and a plurality of pins 232, and the transistor body 231 is attached to the second placement plane 112.

As shown in FIG. 4 and FIG. 5, the base 11 is formed with a pair of ribs 113 on two sides of the first placement plane 111; the pair of the ribs 113 and the first placement plane 111 have formed a first accommodating space 110, and the power body 221 is accommodated in the first accommodating space 110.

Specifically, the base 11 is formed with a pair of supporting plates 114 at a side away from the first placement plane 111. Preferably, the pair of supporting plates 114 form a second accommodating space 115 on the base 11, and a part of the heat dissipating fins 12 are disposed in the second accommodating space 115. Besides, the pair of supporting plates 114 are extended corresponding to the pair of ribs 113 respectively. The supporting plate 114 is located on the same plane as the rib 113 at a side away from the second accommodating space 115.

Furthermore, the heat dissipating fins 12 include a plurality of first heat dissipating fins 121 and a plurality of second heat dissipating fins 122. The first heat dissipating fins 121 are disposed on the supporting plates 114, and the second heat dissipating fins 122 are disposed in the second accommodating space 115. Preferably, the extending directions of the first heat dissipating fins 121 and the second heat dissipating fins 122 are perpendicular with each other.

In one embodiment of the present invention, the electronic device 20 is an uninterrupted system, the power module 22 is an inverter module, and the transistor is a switch assembly unit. Moreover, the first placement plane 111 has a plurality of first screw holes 116, and each of the power modules 22 is fastened on the first screw hole 116 by inserting a screw 30. In addition, the second placement plane 112 has a plurality of second screw holes 117, and each of the transistors 23 is fastened to the second screw hole 117 by inserting another screw 30.

It is worthy of notice that, in the present embodiment, the base 11 has two second placement planes 112 at two sides of the first placement plane 111 respectively, and the two second placement planes 112 are respectively provided with a plurality of transistors 23 and a plurality of first heat dissipating fins 121. In real practice, the base 11 can have only one second placement plane 112 at one side of the supporting plate 114; besides, the supporting plate 114 on the other side can form the first heat dissipating fins 121 individually on the surface thereof.

As shown in FIG. 6, in the present embodiment, the circuit board 21 is disposed at a side of the base 11 formed with the first placement plane 111. The soldering legs 222 of the power module 22 and the pins 232 of the transistor 23 are inserted on the circuit board 21 for electrical connection.

Figure 7:
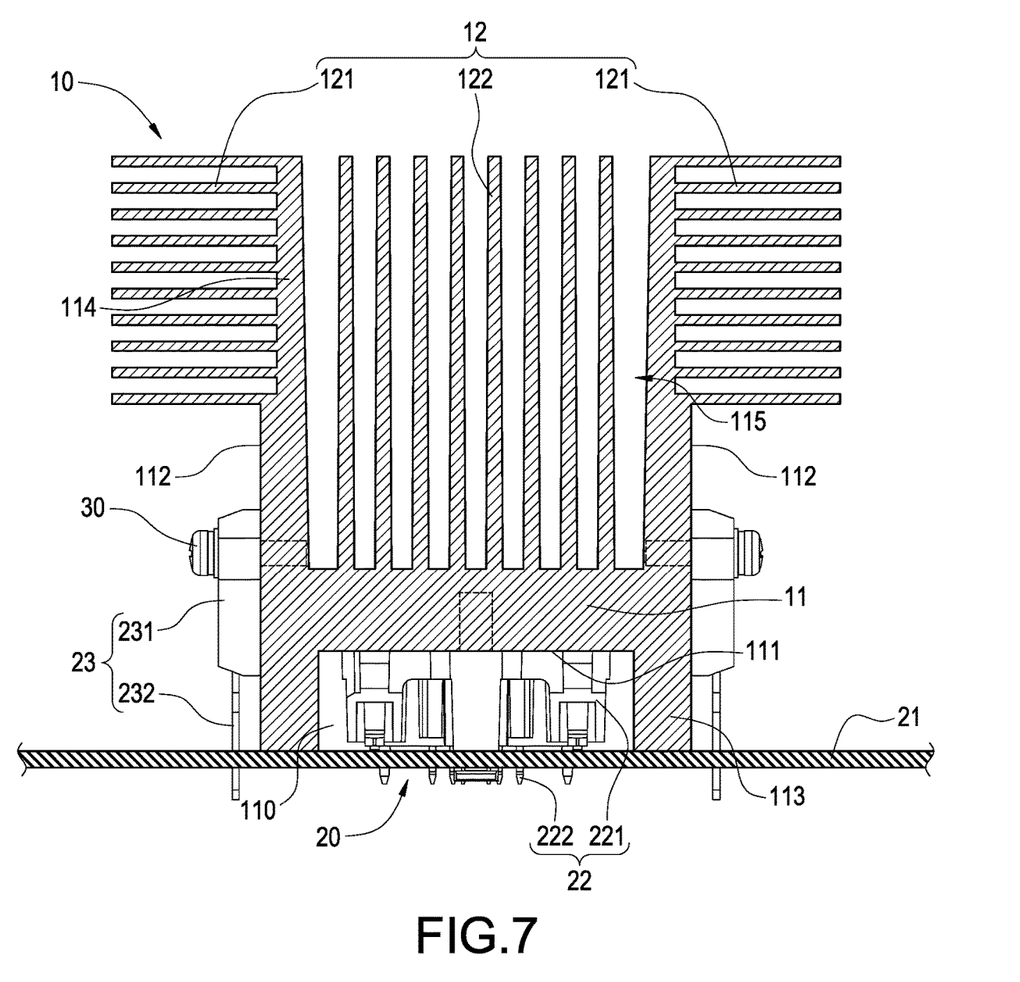
FIG. 7 is a cross sectional view of assembly of integrated electronic device of the present invention.
Figure 8:
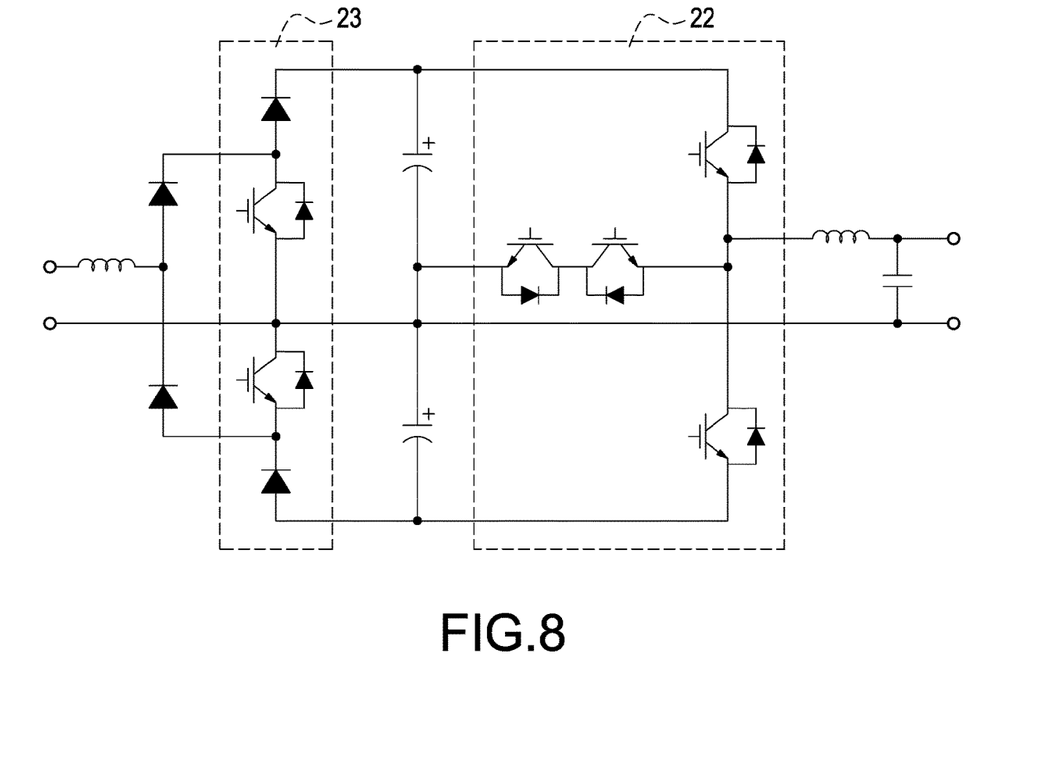
FIG. 8 is a circuit schematic view of the present invention.

Please also refer to FIG. 7 and FIG. 8, they depict a cross sectional view of assembly of integrated electronic device and a circuit schematic view of the present invention. From the FIG. 7, the cross section of the base 11 is substantially in H-shaped, and the base 11 is formed with a first accommodating space 110 and a second accommodating space 115 located oppositely. The power module 22 is attached to one side of the first accommodating space 110, and the second heat dissipating fins 122 are received in the second accommodating space 115. In addition, two sides of the first accommodating space 110 and the second accommodating space 115 are provided with one second placement plane 112 respectively, and the transistors 23 are attached to the two second placement planes 112 separately.

It is worth of noticing that, the circuit board 21 is disposed at a side of the first accommodating space 110 and the second placement planes 112, and the circuit board 21 has provided with a plurality of plug holes 210. The plug holes 210 are disposed corresponding to the soldering legs 222 of the power module 22 and the pins 232 of the transistor 23, thus the soldering legs 222 and the pins 232 can be combined on the circuit board 21.

Finally, the integrated electronic device 1 can be fixed by a soldering process of wave soldering, thereby the assembly of the integrated electronic device 1 will be completed. As shown in FIG. 8, after the integrated electronic device 1 of the present invention is assembled through the above manner, the power module 22 and the transistors 23 are connected to the circuit board 21 to achieve the purpose of electrical connection with each other.

It is worthy of notice that, the first heat dissipating fins 121 are located at a side of the support plane 114 away from the first placement plane 112 so that the second placement plane 112 can be adjacent to the first placement plane 112. Accordingly, when the integrated electronic device 1 is soldered by a soldering furnace, the solders may not be adhered to the first heat dissipating fins 121 so as to maintain the appearance of the integrated electronic device 1.

Figure 9:
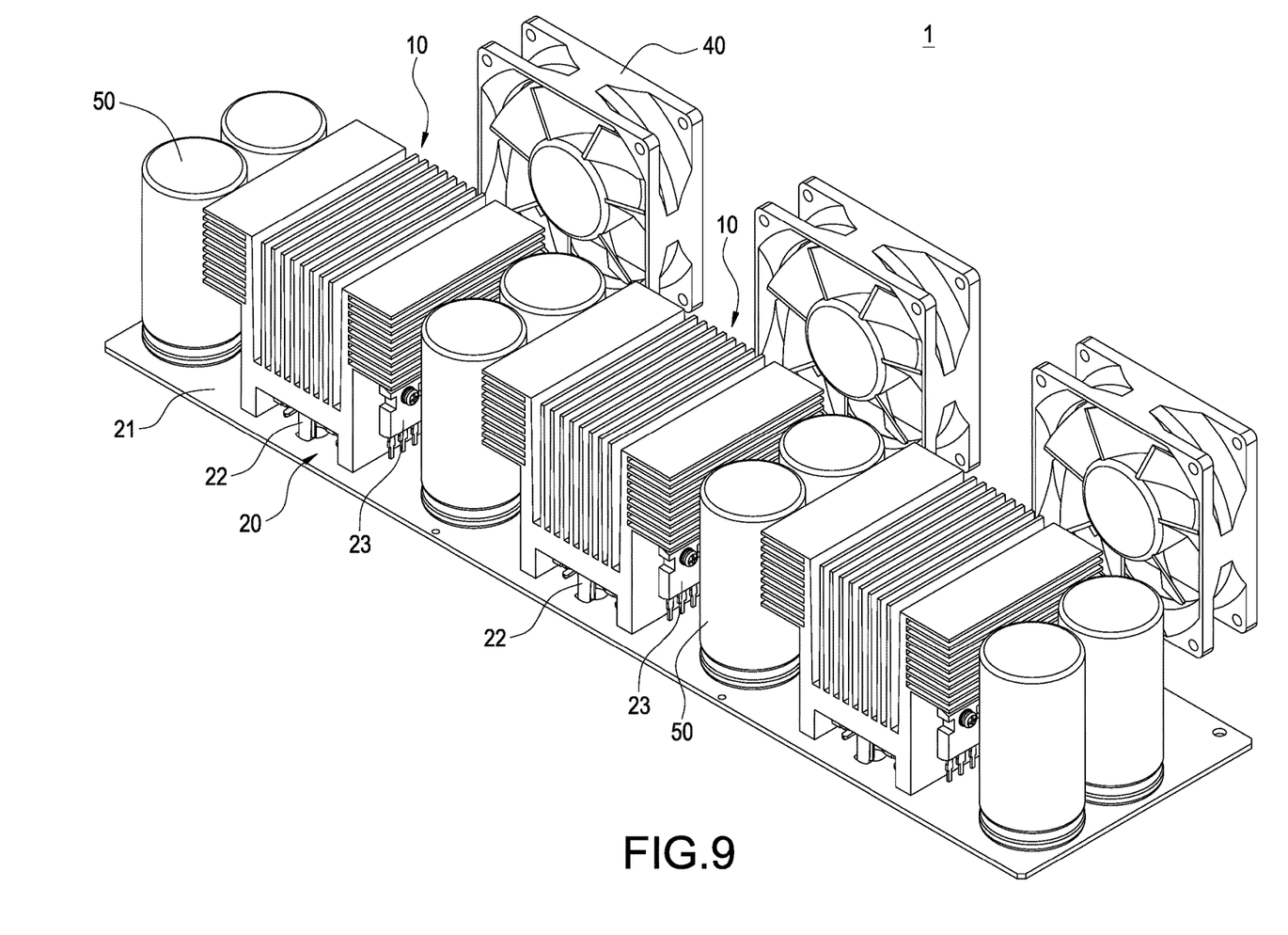
FIG. 9 is another perspective schematic view of integrated electronic device of the present invention.
Figure 10:
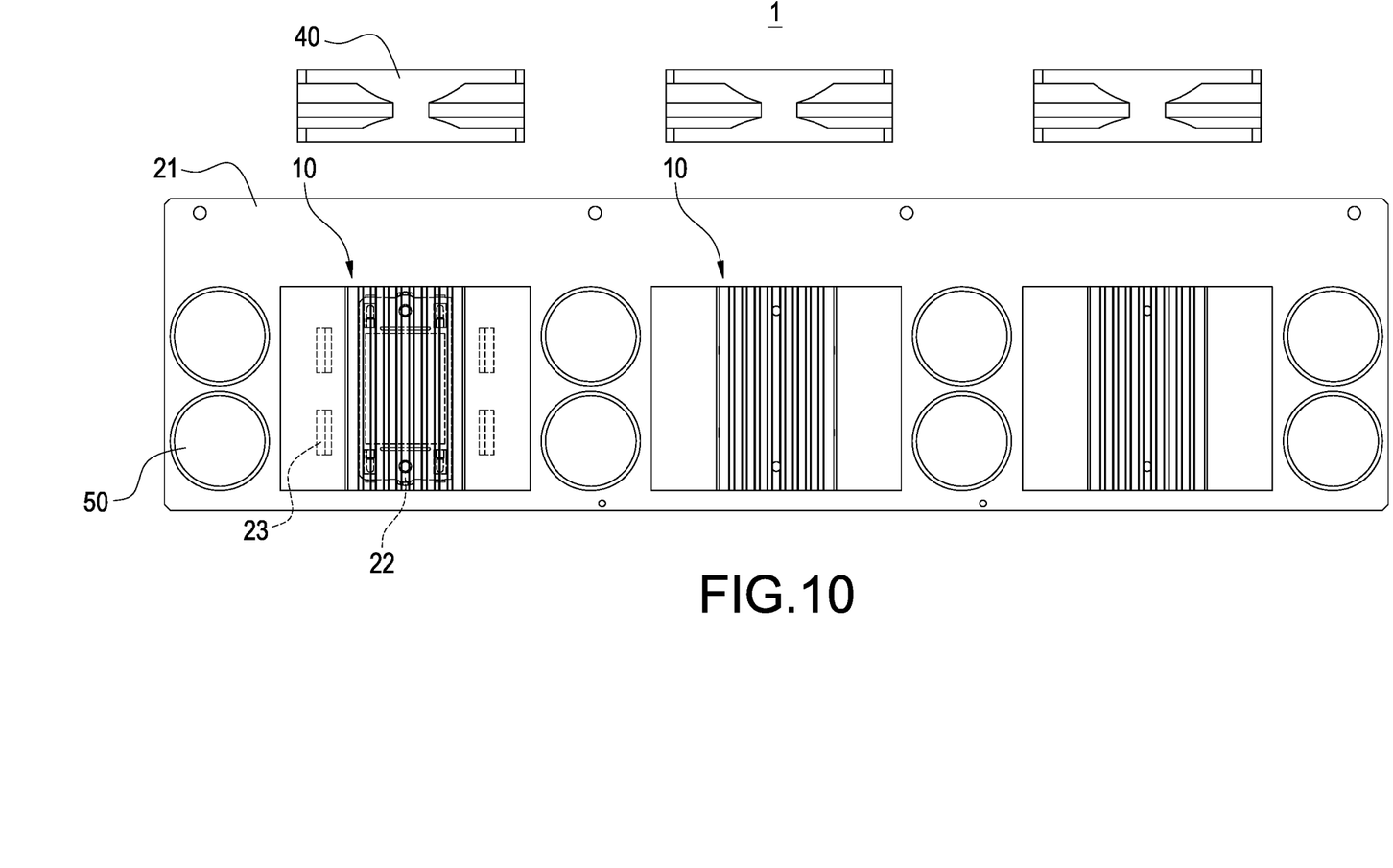
FIG. 10 is a top view of another embodiment of the present invention.

Please further refer to FIG. 9 and FIG. 10, they depict a perspective schematic view and a top view of another embodiment of the present invention. As shown in figures, the electronic device 1 further includes at least one fan 40 and a plurality of capacitor components 50. The fan 40 is located at a side of the heat sink 10; the capacitor components 50 are located on the circuit board 21 and at a side of the heat sink 10.

More specifically, in the present embodiment, a quantity of the heat sink 10, the power module 22 and the fan 40 is plural. Moreover, the heat sink 10 (includes the power module 22 and the transistors 23) are located on the circuit board 21 with an interval, and the fans 40 are disposed at one side of each of the heat sinks 10 respectively. Thereby, airflows generated by the fan 40 can be directly blown to the heat sink 10 without additionally providing a wind guide plate so that the duct design can be simplified. Further, the heat sinks 10 disposed at intervals are provided capacitor elements therebetween.

It should be noted that, in the integrated electronic device 1 of the present invention, the power module 22 and the transistors 23 are attached to different sides of the same heat sink 10 so that heat of heating elements at different places can be dissipated simultaneously by the heat sink 10. Since heat sinks are not necessary configured to the power module 22 and the transistors 23 separately, therefore, the number of the heat sinks can be reduced and the occupied space of the circuit board 21 can be greatly reduced. Thereby the power density of the heat sink 10 can be enhanced.

Although the present invention has been described with reference to the preferred embodiment thereof, it will be understood that the invention is not limited to the details thereof. Various substitutions and improvements have been suggested in the foregoing description, and others will occur to those of ordinary skill in the art. Therefore, all such substitutions and improvements are intended to be embraced within the scope of the invention as defined in the appended claims.

What is claimed is:

1. An integrated electronic device, comprising:
   a heat sink including a base and a plurality of heat dissipating fins; one side of the base having a first placement plane, and another side of the base provided with the heat dissipating fins and having at least one second placement plane, wherein the second placement plane is adjacent to the first placement plane; and
   an electronic device including a circuit board, a power module and a plurality of transistors; the power module including a power body and a plurality of soldering legs, and the power body attached to the first placement plane; each transistor having a transistor body and a plurality of pins, and the transistor body attached to the second placement plane, wherein the circuit board is disposed at a side of the base where the first placement plane is formed; the soldering legs of the power module and the pins of the transistors are inserted on the circuit board,
   wherein the second placement plane is provided with a plurality of screw holes, and each transistor is fastened on each screw hole by inserting a screw.

2. The integrated electronic device according to claim 1, wherein the base is formed with a pair of ribs on two sides of the first placement plane, respectively; the pair of ribs and the first placement plane have formed a first accommodating space, and the power body is accommodated in the first accommodating space.

3. The integrated electronic device according to claim 2, wherein the base is formed with a pair of supporting plates at a side away from the first placement plane.

4. The integrated electronic device according to claim 3, wherein the pair of supporting plates form a second accommodating space on the base, and a part of the heat dissipating fins are disposed in the second accommodating space.

5. The integrated electronic device according to claim 4, wherein the pair of the supporting plates are extended corresponding to the pair of ribs respectively; the supporting plate is located on the same plane as the rib at a side away from the second accommodating space.

6. The integrated electronic device according to claim 4, wherein the heat dissipating fins include a plurality of first heat dissipating fins and a plurality of second heat dissipating fins; the first heat dissipating fins are disposed on the supporting plates, and the second heat dissipating fins are disposed in the second accommodating space.

7. The integrated electronic device according to claim 6, wherein extending directions of the first heat dissipating fins and the second heat dissipating fins are perpendicular with each other.

8. The integrated electronic device according to claim 6, wherein the base has two second placement planes on two sides of the first placement plane respectively, and each second placement planes is disposed with a plurality of transistors and a plurality of first heat dissipating fins.

9. The integrated electronic device according to claim 8, wherein the first heat dissipating fins are located at a side of the supporting plate away from the first placement plane.

10. The integrated electronic device according to claim 1, wherein the electronic device is an uninterrupted system, the power module is an inverter module, and the transistor is a switch assembly unit.

11. The integrated electronic device according to claim 1, further including at least one fan, wherein the at least one fan is located at a side of the heat sink.

12. The integrated electronic device according to claim 1, further including a plurality of capacitor components, wherein the capacitor components are located on the circuit board and at a side of the heat sink.

13. The integrated electronic device according to claim 1, wherein a quantity of the heat sink and the power module is plural; the heat sink and the power module are located on the circuit board with an interval separately.

* * * * *